US007256084B2

United States Patent
Lim et al.

(10) Patent No.: US 7,256,084 B2
(45) Date of Patent: Aug. 14, 2007

(54) COMPOSITE STRESS SPACER

(75) Inventors: Khee Yong Lim, Singapore (SG); Wenhe Lin, Singapore (SG); Chung Woh Lai, Singapore (SG); Yong Meng Lee, Singapore (SG); Liang Choo Hsia, Singapore (SG); Young Way Teh, Singapore (SG); John Sudijono, Singapore (SG); Wee Leng Tan, Singapore (SG); Hui Peng Koh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 45 days.

(21) Appl. No.: 11/122,667

(22) Filed: May 4, 2005

(65) Prior Publication Data

US 2006/0252194 A1 Nov. 9, 2006

(51) Int. Cl.
*H01L 21/8238* (2006.01)

(52) U.S. Cl. .................... 438/199; 438/230; 438/231; 257/E21.637

(58) Field of Classification Search ............... 438/199, 438/200, 230, 231, 232
See application file for complete search history.

(56) References Cited

U.S. PATENT DOCUMENTS

| 4,966,663 | A | 10/1990 | Mauger |
| 6,191,462 | B1 * | 2/2001 | Chen-Hua ................... 257/408 |
| 6,512,273 | B1 | 1/2003 | Krivokapic et al. |
| 6,573,172 | B1 | 6/2003 | En et al. |
| 6,825,529 | B2 | 11/2004 | Chidambarrao et al. |
| 6,902,971 | B2 * | 6/2005 | Grudowski ................. 438/218 |
| 2003/0040158 | A1 | 2/2003 | Saitoh |
| 2004/0104405 | A1 | 6/2004 | Huang et al. |
| 2004/0113217 | A1 | 6/2004 | Chidambarrao et al. |
| 2004/0132249 | A1 * | 7/2004 | Mitsuda et al. ............. 438/260 |
| 2004/0191975 | A1 | 9/2004 | Weber et al. |
| 2004/0262784 | A1 * | 12/2004 | Doris et al. ................. 257/900 |

* cited by examiner

*Primary Examiner*—Michael Trinh
(74) *Attorney, Agent, or Firm*—William J. Stoffel

(57) ABSTRACT

An example method embodiment forms spacers that create tensile stress on the substrate on both the PFET and NFET regions. We form PFET and NFET gates and form tensile spacers on the PFET and NFET gates. We implant first ions into the tensile PFET spacers to form neutralized stress PFET spacers. The neutralized stress PFET spacers relieve the tensile stress created by the tensile stress spacers on the substrate. This improves device performance.

19 Claims, 2 Drawing Sheets

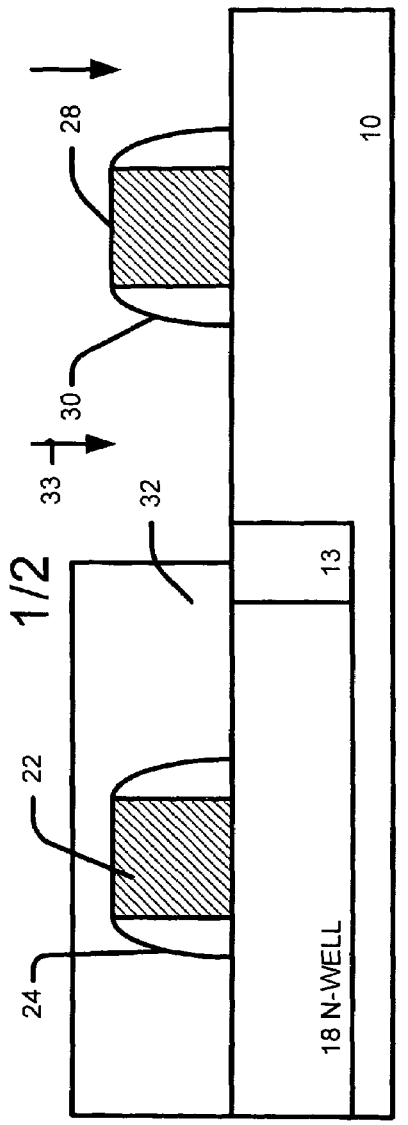
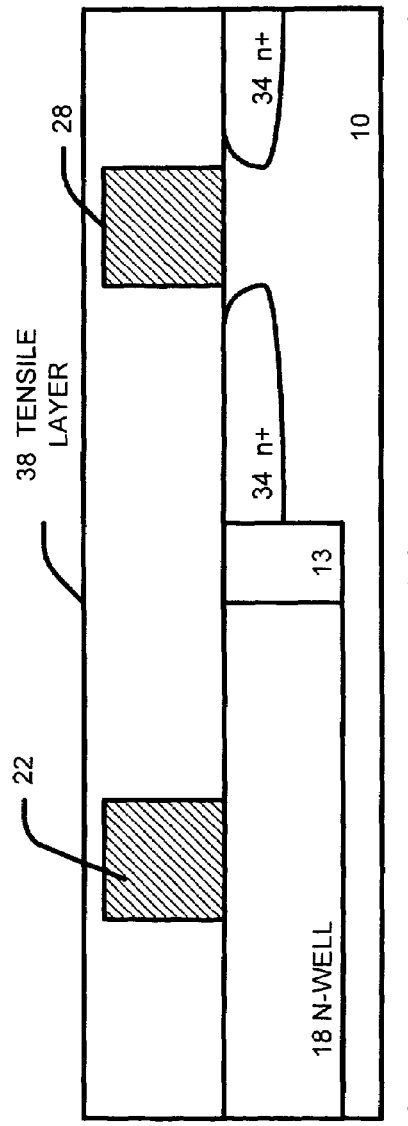
FIGURE 1
FIGURE 2

COMPOSITE STRESS SPACER

BACKGROUND OF INVENTION

1) Field of the Invention

This invention pertains to inventive methods of manufacturing a semiconductor device for improving device performance, and to the resulting unique high-performance device structure. In particular, this invention has improved charge mobility in FET devices by structurally imposing tensile and compression forces in a device substrate during device fabrication.

2) Description of the Prior Art

One of the main challenges of deep submicron transistor design is to improve its carrier mobility, so that its drive current is higher and resulted in higher ring oscillator speed. It is known that tensile stress favor electron's mobility, while compressive stress favor hole's mobility.

The importance of overcoming the various deficiencies noted above is evidenced by the extensive technological development directed to the subject, as documented by the relevant patent and technical literature. The closest and apparently more relevant technical developments in the patent literature can be gleaned by considering the following.

U.S. Pat. No. 6,825,529 and Ser. No. US 20040113217A1 Stress inducing spacers—Spacer structure for semiconductor devices formed in substrate, has two spacer structures, each comprising stress inducing material adjacent to both sidewall of one of device's gate terminal and its channel which applies mechanical stress—Inventor: Chidambarrao U.S. Pat. No. 6,512,273: Method and structure for improving hot carrier immunity for devices with very shallow junctions—Complementary metal oxide semiconductor field effect transistor includes silicon nitride and polysilicon spacers provided on edge surface gate of p-channel and n-channel devices=Inventor: Krivokapic, Zoran U.S. Pat. No. 6,573,172: Methods for improving carrier mobility of PMOS and NMOS devices—Fabrication of semiconductor device by forming P-channel and N-channel metal oxide semiconductor transistors in wafer, forming tensile film on P-channel transistor and forming compressive film on N-channel transistor—Inventor: En, et al.

Ser. No. US20040191975 A1: Nitrogen Controlled Growth Of Dislocation Loop In Stress Enhanced Transistor—MOSFET fabricating method, involves implanting silicon in substrate to form dislocation loop in substrate below conduction channel, and doping substrate with nitrogen below conduction channel—Inventor: Weber et al.

Ser. No. US20040104405A1: Novel CMOS device—Improving mobility of holes and electrons within semiconductor device structure, involves forming first and second stress layers over p- and n-type metal oxide semiconductor device respectively—Inventor: Huang Ser. No. US20030040158A1: Semiconductor device and method of fabricating the same—Semiconductor device includes first nitride layer containing tensile stress and second nitride layer containing compressive stress—Inventor: Saitoh, Takehiro U.S. Pat. No. 20040262784 High performance CMOS device structures and method of manufacture—A semiconductor device structure includes at least two field effect transistors formed on same substrate, the first field effect transistor includes a spacer having a first width, the second field effect transistor includes a compressive spacer having a second width, the first width being different than said second width. Preferably, the first width is narrower than the second width. A tensile stress dielectric film forms a barrier etch stop layer over the transistors. Inventors: Bruce B. Doris, Dureseti Chidambarrao, Suk Hoon Ku U.S. Pat. No. 4,966,663: Method for forming a silicon membrane with controlled stress—Silicon membrane with predetermined stress characteristics—made by doping and electrochemical etching. Inventor: Mauger, Philip E.; Santa—A method for fabricating a silicon membrane with predetermined stress characteristics. A silicon substrate is doped to create a doped layer as thick as the desired thickness of the membrane. Stress within the doped layer is controlled by selecting the dopant based on its atomic diameter relative to silicon and controlling both the total concentration and concentration profile of the dopant. The membrane is then formed by electrochemically etching away the substrate beneath the doped layer.

SUMMARY OF THE INVENTION

The embodiments of the present invention provides a structure and a method of manufacturing a CMOS device which are characterized as follows.

A first example embodiment is a method of fabrication of a semiconductor device structure comprising the steps of:
  providing a substrate having a PFET region and a NFET region, a PFET gate on said PFET region, and a NFET gate on said NFET region;
  forming first PFET spacers on said PFET gate and forming first NFET spacers on said NFET gate;
  forming NFET source/drain regions adjacent to said NFET spacers;
  removing said first PFET spacers and first NFET spacers;
  forming tensile PFET spacers on the PFET gate and tensile NFET spacers on the NFET gate;
  implanting first ions into tensile PFET spacers to form a neutralized PFET spacers whereby the first ions reduce the stress in the neutralized PFET spacers and reduce the stress in the PFET region;
  forming PFET source/drain regions adjacent to said PFET gate;
  implanting P type impurities into said PFET region to from the PFET source/drain regions.

Another example embodiment is a semiconductor device structure comprised of:
  a substrate having a PFET region and a NFET region, a PFET gate on said PFET region, and a NFET gate on said NFET region;
  NFET source/drain regions adjacent to said NFET spacers;
  neutralized PFET spacers on the PFET gate and tensile NFET spacers on the NFET gate;
  PFET source/drain regions adjacent to said PFET gate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 4 are cross sectional views for illustrating a method for manufacturing a CMOS device with composite stress spacer according to an example embodiment of the present invention.

DETAILED DESCRIPTION OF THE EXAMPLE EMBODIMENTS

I. EXAMPLE EMBODIMENTS

A. Introduction

Figure 3:
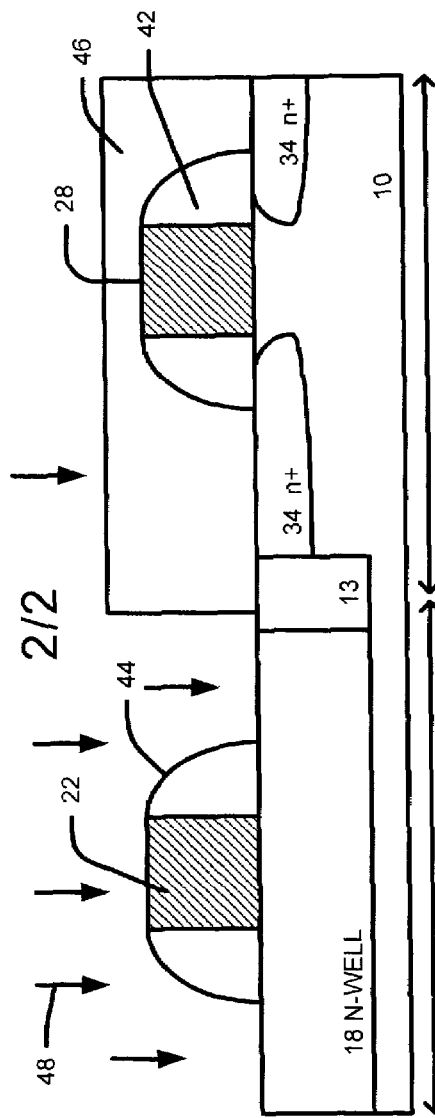

In the example embodiments we disclosure techniques to put tensile stress under the nFET gate channel without affecting pFET channel by using composite stress spacer scheme. The schemes enhance electron mobility without compromising hole mobility. In addition, an example embodiment has a composite spacer scheme that allows the nFET and pFET transistors to have different spacer thickness, and thus Vt roll-off for individual device can be tailored.

In the example embodiments, we present techniques for achieving dual stress for device without introducing complicated process in the normal CMOS process sequence. The example embodiments are effective and thicker spacer width for pMOSFET before the source drain implant improves the Vt roll-off and substhreshold slope for pFET.

B. First Example Method Embodiment

A first example method embodiment is shown in FIGS. 1 to 4. The first example method embodiment forms tensile stress spacers that create tensile stress on the substrate in both the PFET and NFET regions. A first implant into the tensile stress spacers relieves the substrate tensile stress created by the stress spacers on the substrate thus improving hole carrier mobility in the substrate near the channel regions.

C. Substrate Having a PFET Region and a NFET Region

Referring to FIG. 1, we provide a substrate 10 having a PFET region 12 and a NFET region 14. We provide a nwell region 18 in the PFET region 12, a PFET gate 22 on the PFET region 12 and a NFET gate 28 on the NFET region 14. The substrate can be silicon wafer or a SOI substrate. The substrate can have an optional pwell in the NFET region. The gates can comprise a gate dielectric layer and a gate electrode. The substrate can comprise isolation regions, such as STI regions 13.

D. First PFET Spacers on the PFET Gate and First NFET Spacers on the NFET Gate

Still referring to FIG. 1, we form first PFET spacers 24 on the PFET gate 22 and first NFET spacers 30 on the NFET gate 28. The spacers are preferably made of a neutral stress material, such as RTCVD silicon nitride.

E. NFET Source/Drain Regions Adjacent to the NFET Spacers

We then form NFET source/drain regions 34 adjacent to the NFET spacers 30.

As shown in FIG. 1, we form a NFET S/D resist layer 32 that has openings over areas where the NFET Source/Drain regions will be formed.

N type Ions 33 preferably are implanted into the substrate in the NFET region adjacent to the NFET spacer 30 to form NFET source/drain regions 34. (See FIG. 2). A NFET channel region is under said NFET gate between the NFET Source/Drain regions.

F. Removing the First PFET Spacers and First NFET Spacers

Referring to FIG. 2, we remove the first PFET spacers 24 and first NFET spacers 30. The spacers can be removed using a selective etch.

G. Tensile PFET Spacers and Tensile NFET Spacers

Next, we form tensile PFET spacers 44 on the PFET gate 22 and tensile NFET spacers 42 on the NFET gate 28. As shown in FIGS. 2 and 3, one way to accomplish this is to deposit a tensile nitride layer 38 over the substrate surface and then use an anisotropic etch to form the PFET gate spacer 44 and tensile NFET spacers 42.

The tensile nitride layer has a tensile stress of between about 8 Gdynes/cm$^2$ and 16 Gdynes/cm$^2$. This creates a tensile stress on the substrate.

The tensile spacers serves to put a tensile stress on the substrate close to the gate and channel region. The tensile stress from the NFET spacers 42 on the NFET channel is desirable since the stress improves electron mobility and the NFET performance.

H. Implanting First Ions into the PFET Spacers, whereby the First Ions Relax the PFET Spacers Referring to FIGS. 3 and 4, we implant first ions 48 into the tensile PFET spacers 44 to form neutralized PFET spacers 44A (see FIG. 4) and implant ions into a top region of the PFET region. We can form a PFET mask 46 and implant first ions 48 (such as Ge, Xe, or other ions) into the tensile PFET spacers 44 and the PFET region 12.

This step is important since the first ions relax the tensile nitride PFET spaces 44. The tensile stress spacer change to a non-tensile or relaxed spacer because of the ion implant into the spacer. When the heavy undoped first (e.g., Ge, Xe, etc.) ions bombard the SiN spacer lattice, some of the lattice bond are broken, making the strain in the spacer lattice reduce.

For example, the tensile PFET spacers 44 can have a tensile stress between 8 Gdynes/cm$^2$ and 16 Gdynes/cm$^2$ before the first ion implant and the neutralized PFET spacers 44A can have a tensile stress between about 2 Gdynes/cm$^2$ and 4 Gdynes/cm$^2$ after the ion implant.

The neutralized PFET spacers 44A and substrate in the PFET region 12 can have a Ge ion (e.g., Ge) concentration between 5E19/cm$^3$ and 1E20/cm$^3$. The Ge ions can be implanted with a dose between 5E14/cm$^2$ and 1E15/cm$^2$ and at an energy between 30 kev and 35 kev.

The substrate in the PFET region 12 can have a Ge ion concentration between 5E19/cm$^3$ and 1E20/cm$^3$. The Ge ions are implanted with a dose between 5E14/cm$^2$ and 1E15/cm$^2$ and at an energy between 30 kev and 35 kev.

I. PFET Source/Drain Regions Adjacent to the PFET Gate

Figure 4:
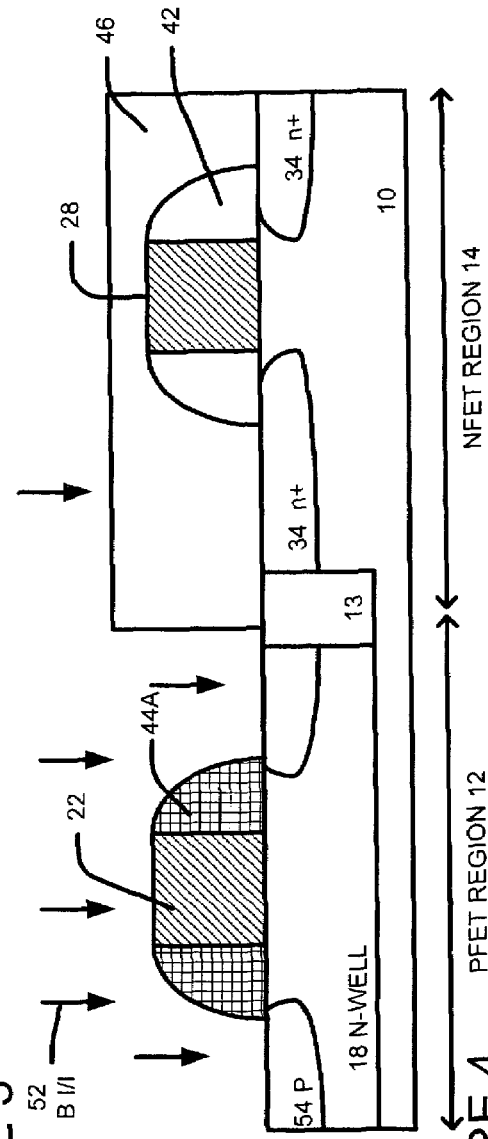

Referring to FIG. 4, we form PFET source/drain regions 54 adjacent to the PFET gate 22. The PFET mask 46 has openings over the PFET region. We use a P-type implant 52 to form PFET source/drain regions 54 adjacent to the PFET gate 22. A PFET channel region is under said PFET gate between the PFET source/drain regions.

As shown in FIG. 4, the pFET region 12 has neutral spacer 44A after ion implant (e.g., Ge) relaxation. The neutral spacer 44A does not put significant tensile stress on the pfet region 12 and thus does not degrade hole mobility. This increases the PFET performance.

Also, the NFETs still have tensile stress spacers 42, which put stress on the NFET region 14 and enhances electron mobility.

Also pFET Vt roll-off is well control with source drain implant done after neutralized tensile spacer 44A formation, and NFET Vt roll-off problem is much less than pFET as it has much heavier As dopants.

The Ge, or Xe ions neutralized tensile stress on pFET spacer, and thereby eliminating degradation on hole mobility by tensioning the substrate. This does not affect electron mobility in nFET. On the other hand, Ge dopants also retard the diffusion of B dopants (e.g., PFET Source and drain regions), thereby improving threshold voltage versus Lpoly roll-off of pFET. After then a spike anneal is preferably performed.

J. Dual with Spacer Option-Different Width PFET and NFET Channels

In an option, the neutralized PFET spacers 44A (or spacers 44) have a first width and the first NFET spacers 30 have a second width where the first width and the second width are not approximately equal. The different spacer width allow us to form different PFET and NFET channel widths/dimensions. The neutralized PFET spacers 44A (or spacers 44) and the first NFET spacers 30 can be used as Implant masks to define the source and drain regions positions. The spacer widths can range from 450 to 650 angstroms. The first width is preferably at least 10% larger or smaller than the second width. The PFET channel can be between about 120% and 80% the width of said NFET channel. The PFET channel can be between 20% wider and 20% narrower than the NFET channel. The bigger the spacer width, the further the S/D implant ion get to the gate channel and thereby causing less lateral short channel effect.

The dual spacer scheme allows NFET and pFET to have different spacer width, making the design optimization of nFET and pFET more flexible.

K. Non-Limiting Example Embodiments

Although this invention has been described relative to specific insulating materials, conductive materials and apparatuses for depositing and etching these materials, it is not limited to the specific materials or apparatuses but only to their specific characteristics, such as conformal and nonconformal, and capabilities, such as depositing and etching, and other materials and apparatus can be substituted as is well understood by those skilled in the microelectronics arts after appreciating the present invention The devices can comprised additional elements or subelements, such as LLD regions, etc.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a semiconductor device structure comprising the steps of:
    a) providing a substrate having a PFET region and a NFET region, a PFET gate over said PFET region, and a NFET gate over said NFET region; said PFET gate having PFET gate sidewalls; said NFET gate having NFET gate sidewalls;
    b) forming NFET source/drain regions adjacent to said NFET gate; then
    c) forming tensile PFET spacers over the PFET gate sidewalls and tensile NFET spacers over the NFET gate sidewalls;
    d) implanting first ions into the tensile PFET spacers to form neutralized PFET spacers whereby the first ions reduce a stress in the neutralized PFET spacers and reduce a stress in the PFET region; and
    e) forming PFET source/drain regions adjacent to said PFET gate.

2. The method of claim 1 wherein the tensile PFET spacers and the tensile NFET spacers have a tensile stress between 8 Gdynes/cm$^2$ and 16 Gdynes/cm$^2$.

3. The method of claim 1 wherein said first ions are Ge or Xe ions and the neutralized PFET spacers have a first ion concentration between 5E19/cm$^3$ and 1E20/cm$^3$; the first ions are implanted with a dose between 5E14/cm$^2$ and 1E15/cm$^2$ and at an energy between 30 kev and 35 kev.

4. The method of claim 1 wherein said first ions are implanted into said tensile PFET spacers and said PFET region; said first ions are Ge ions and the neutralized PFET spacers and the implanted PFET region have a first ion concentration between 5E19/cm$^3$ and 1E20/cm$^3$; the first ions are implanted with a dose between 5E14/cm$^2$ and 1E15/cm$^2$ and at an energy between 30 kev and 35 kev.

5. The method of claim 1 wherein the tensile PFET spacers have a tensile stress between 8 Gdynes/cm$^2$ and 16 Gdynes/cm$^2$ before the first ion implant and the neutralized PFET spacers have a tensile stress between about 2 Gdynes/cm$^2$ and 4 Gdynes/cm$^2$ after the first ion implant.

6. The method of claim 1 which further comprises:
forming first PFET spacers over said PFET gate sidewalls and forming first NFET spacers over said NFET gate sidewalls;
forming the NFET source/drain regions adjacent to said first NFET spacers;
removing said first PFET spacers and the first NFET spacers; and the neutralized PFET spacers have a first width and the first NFET spacers have a second width; the first width and the second width are not approximately equal.

7. The method of claim 1 which further comprises
forming first PFET spacers over said PFET gate sidewalls and forming first NFET spacers over said NFET gate sidewalls;
forming the NFET source/drain regions adjacent to said first NFET spacers; removing said first PFET spacers and the first NFET spacers; and
the neutralized PFET spacers are at least either 10% wider or 10% narrower than said first NFET spacers.

8. The method of claim 1 which further comprises:
forming first PFET spacers over said PFET gate sidewalls and forming first NFET spacers over said NFET gate sidewalls;
forming the NFET source/drain regions adjacent to said first NFET spacers;
removing said first PFET spacers and the first NFET spacers; and
the neutralized PFET spacers have a first width and the first NFET spacers have a second width; the first width and the second width are not approximately equal; the first width and said second width are between 450 to 650 angstroms.

9. The method of claim 1 which further includes a PFET channel in said substrate under said PFET gate and a NFET channel in said substrate under said NFET gate; the PFET channel is between about 80% and 120% the width of said NFET channel.

10. The method of claim 1 which further comprises:
forming first PFET spacers over said PFET gate sidewalls and forming first NFET spacers over said NFET gate sidewalls; then
forming the NFET source/drain regions adjacent to said first NFET spacers; and then removing said first PFET spacers and said first NFET spacers.

11. The method of claim 1 wherein step (e) is performed after step (d).

12. The method of claim 1 wherein step (a) is performed before step (b),
step (b) is performed before step (c),
step (c) is performed before step (d), and
step (d) is performed before step (e).

13. A method of fabrication of semiconductor device structure comprising the steps of:
a) providing a substrate having a PFET region and a NFET region, a nwell region in said PFET region, a PFET gate over said PFET region, and a NFET gate over said NFET region; said PFET gate having PFET gate sidewalls; said NFET gate having NFET gate sidewalls;
b) forming first PFET spacers over said PFET gate sidewalls and forming first NFET spacers over said NFET gate sidewalls;
c) forming NFET source/drain regions adjacent to said first NFET spacers;
d) removing said first PFET spacers and said first NFET spacers;
e) forming tensile PFET spacers over the PFET gate sidewalls and tensile NFET spacers over the NFET gate sidewalls;
(1) the tensile PFET spacers and the tensile NFET spacers have a tensile stress between 8 Gdynes/cm$^2$ and 16 Gdynes/cm$^2$;
f) implanting first ions into the tensile PFET spacers to form neutralized PFET spacers and into said PFET region whereby the first ions relax a stress in the neutralized PFET spacers and a stress in the PFET region;
(1) the neutralized PFET spacers have a tensile stress between about 2 Gdynes/cm$^2$ and 4 Gdynes/cm$^2$ after the first ion implant;
(2) said first ions are Ge or Xe ions; and
(g) implanting P type impurities into said PFET region to form PFET source/drain regions adjacent to said neutralized PFET spacers.

14. The method of claim 13 wherein the neutralized PFET spacers have a first ion concentration between 5E19/cm$^3$ and 1E20/cm$^3$; the first ions are implanted with a dose between 5E14/cm$^2$ and 1E15/cm$^2$ and at an energy between 30 kev and 35 kev.

15. The method of claim 13 wherein said first ions are Ge ions and the neutralized PFET spacers have a first ion concentration between 5E19/cm$^3$ and 1E20/cm$^3$ in the regions where the first ions were implanted; the first ions are implanted with a dose between 5E14/cm$^2$ and 1E15/cm$^2$ and at an energy between 30 kev and 35 kev.

16. The method of claim 13 wherein the neutralized PFET spacers have a first width and the first NFET spacers have a second width; the first width and the second width are not approximately equal; the first width and said second width are between 450 to 650 angstroms.

17. A method of fabrication of a semiconductor device structure comprising the steps of:
a) providing a substrate having a PFET region and a NFET region, a PFET gate over said PFET region, and a NFET gate over said NFET region; said PFET gate having PFET gate sidewalls; said NFET gate having NFET gate sidewalls;
b) forming first PFET spacers over said PFET gate sidewalls and forming first NFET spacers over said NFET gate sidewalls;
c) forming NFET source/drain regions adjacent to said first NFET spacers; then
d) removing said first PFET spacers and said first NFET spacers;
e) forming tensile PFET spacers over the PFET gate sidewalls and forming tensile NFET spacers over the NFET gate sidewalls;
f) implanting first ions into the tensile PFET spacers to form neutralized PFET spacers whereby the first ions reduce a stress in the neutralized PFET spacers and reduce a stress in the PFET region; and
g) forming PFET source/drain regions adjacent to said PFET gate.

18. The method of claim 17 wherein step (b) is performed after step (a);
step (c) is performed after step (b); and
step (d) is performed after step (c).

19. The method of claim 17 wherein the neutralized PFET spacers have a first width and the first NFET spacers have a second width; the first width and the second width are not approximately equal.

* * * * *